(12) United States Patent
Roh et al.

(10) Patent No.: US 8,399,994 B2
(45) Date of Patent: Mar. 19, 2013

(54) SEMICONDUCTOR CHIP AND SEMICONDUCTOR PACKAGE HAVING THE SAME

(75) Inventors: Hee Ra Roh, Seoul (KR); Il Hwan Cho, Icheon-si (KR); Jae Min Kim, Icheon-si (KR); Hyun Chul Seo, Seoul (KR); Dong Hwan Seol, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/283,769

(22) Filed: Oct. 28, 2011

(65) Prior Publication Data
US 2013/0037930 A1  Feb. 14, 2013

(30) Foreign Application Priority Data
Aug. 9, 2011  (KR) .......................... 10-2011-0078851

(51) Int. Cl.
*H01L 23/12*  (2006.01)
*H01L 23/48*  (2006.01)
*H01L 29/40*  (2006.01)

(52) U.S. Cl. ................................. 257/777; 257/E25.029
(58) Field of Classification Search .................. 257/777, 257/E25.029
See application file for complete search history.

(56) References Cited

U.S. PATENT DOCUMENTS

| | | | | |
|---|---|---|---|---|
| 6,347,037 B2 * | 2/2002 | Iijima et al. | .................... | 361/704 |
| 6,623,178 B1 * | 9/2003 | Sakurai et al. | .................... | 385/92 |
| 6,906,407 B2 * | 6/2005 | Byers et al. | .................... | 257/686 |
| 7,242,101 B2 * | 7/2007 | Ararao et al. | .................... | 257/784 |
| 7,282,390 B2 * | 10/2007 | Tan et al. | .................... | 438/109 |
| 7,332,820 B2 * | 2/2008 | Tan et al. | .................... | 257/777 |
| 7,482,686 B2 * | 1/2009 | Zhao et al. | .................... | 257/710 |
| 8,119,447 B2 * | 2/2012 | Pagaila et al. | .................... | 438/106 |

* cited by examiner

*Primary Examiner* — David Zarneke
(74) *Attorney, Agent, or Firm* — William Park & Associates Ltd.

(57) ABSTRACT

A semiconductor chip includes a body part having a first surface and a second surface facing away from the first surface, and an opening passing from the first surface to the second surface of the body part.

36 Claims, 9 Drawing Sheets

SEMICONDUCTOR CHIP AND SEMICONDUCTOR PACKAGE HAVING THE SAME

CROSS-REFERENCE TO RELATED APPLICATIONS

The present application claims priority to Korean patent application number 10-2011-78851 field on Aug. 9, 2011, which is incorporated herein by reference in its entirety.

BACKGROUND OF THE INVENTION

The present invention relates to a semiconductor chip and a semiconductor package having the same.

As electronic products trend toward miniaturization, the size of a package used in an electronic product is decreasing, and as complex application products are developed, packages capable of performing various functions are demanded. Under these situations, a system-in-package (SIP), in which semiconductor chips with different functions, for example, a system chip such as a CPU (central processing unit) and/or a GPU (graphic processing unit) and a memory chip are enclosed in one package to realize a system, has been highlighted in the art.

However, heat generated by a system chip may damage a memory chip. Accordingly the operation performance and the reliability of the memory chip may deteriorate. While a heat sink can be used to alleviate thermal damage, as space between a system chip and a memory chip and the overlap area between the system chip and the heat sink decrease due to high degree of integration, heat dissipation effect becomes poor. As a consequence, it is difficult to avoid local thermal damage to the memory chip near the system chip. Nevertheless, since a semiconductor package to be applied to a commercialized module should be manufactured to conform to the standard regulated in Joint Electron Device Engineering Council (JEDEC), even though the size of a semiconductor chip decreases, the size of a semiconductor package cannot be decreased. Since a decrease in the size of a semiconductor chip does not directly result in an increase in the degree of integration of a semiconductor package, limitations exist in achieving high degree of integration.

BRIEF SUMMARY OF THE INVENTION

Embodiments of the present invention are directed to a semiconductor chip which is suitable for lessening thermal damage and improving the degree of integration, and a semiconductor package using the same.

In one embodiment of the present invention, a semiconductor chip includes: a body part having a first surface and a second surface facing away from the first surface; and an opening passing from the first surface to the second surface of the body part. A second semiconductor chip may be placed in the opening of the first chip.

In another embodiment of the present invention, a semiconductor package includes: a substrate; a first semiconductor chip placed on an upper surface of the substrate; and a second semiconductor chip having an opening which corresponds to the first semiconductor chip, and placed on the upper surface of the substrate such that the first semiconductor chip is exposed through the opening.

The first semiconductor chip and the second semiconductor chip may be different kinds of chips. For example, the first semiconductor chip may be a memory chip, and the second semiconductor chip may be a system chip.

The first semiconductor chip may have a rectangular hexahedral shape, and the second semiconductor chip may have the shape of a hollow rectangular frame.

The semiconductor package may further include: a molded part sealing the upper surface of the substrate including the first and second semiconductor chips; and external connection terminals mounted to a lower surface of the substrate. The semiconductor package may further include: a heat sink mounted onto the molded part.

The substrate may include on the upper surface thereof first connection pads electrically connected with the first semiconductor chip and second connection pads electrically connected with the second semiconductor chip.

The first semiconductor chip may include, on a first surface thereof facing the substrate, bonding pads electrically connected with the first connection pads of the substrate. The semiconductor package may further include: connection members electrically connecting the bonding pads of the first semiconductor chip with the first connection pads of the substrate. The connection members may include any ones of bumps and solder balls.

The second semiconductor chip may include, on one surface thereof facing the substrate, bonding pads electrically connected with the second connection pads of the substrate. The semiconductor package may further include: connection members electrically connecting the bonding pads of the second semiconductor chip with the second connection pads of the substrate. The connection members may include any ones of bumps and solder balls.

The second semiconductor chip may include, on the surface thereof facing away from the substrate, bonding pads electrically connected with the second connection pads of the substrate. The semiconductor package may further include: connection members electrically connecting the bonding pads of the second semiconductor chip with the second connection pads of the substrate. The connection members may include wires.

The substrate may include: a through hole passing through the upper surface and the lower surface facing away from the upper surface; first connection pads formed on the lower surface and electrically connected with the first semiconductor chip; and second connection pads formed on the upper surface and electrically connected with the second semiconductor chip.

The first semiconductor chip may include, on a first surface thereof facing the substrate, bonding pads electrically connected with the first connection pads of the substrate. The semiconductor package may further include: connection members electrically connecting the bonding pads of the first semiconductor chip with the first connection pads of the substrate through the through hole. The connection members may include wires. The semiconductor package may further include: an additional molded part sealing a center portion of the lower surface of the substrate including the through hole and the connection members.

At least two first semiconductor chips may be horizontally mounted on the upper surface of the substrate in the opening. The first semiconductor chips may be the same kind of chips. At least one of the first semiconductor chips may be a different kind of chip from the other first semiconductor chips. The first semiconductor chips may have the same size, or at least one of the first semiconductor chips may have different size from another of the first semiconductor chips.

The semiconductor package may further include: an interposer interposed between the substrate and the first and second semiconductor chips, and including first through wiring lines that electrically connect the substrate with the first semiconductor chip and second through wiring lines that electrically connect the substrate with the second semiconductor chip.

The first semiconductor chip may further include first through electrodes that pass through the first surface facing the substrate and a second surface facing away from the first surface. At least two first semiconductor chips may be stacked such that first through electrodes of the respective first semiconductor chips are vertically connected with each other. The semiconductor package may further include: an interposer interposed between the substrate and the first and second semiconductor chips, and including first through wiring lines which electrically connect the substrate with the first through electrodes of the first semiconductor chips and second through wiring lines which electrically connect the substrate with the second semiconductor chip.

The second semiconductor chip may further include second through electrodes that pass through the first surface facing the substrate and the second surface facing away from the first surface. At least two second semiconductor chips may be stacked such that second through electrodes of the respective second semiconductor chips are vertically connected with each other. The semiconductor package may further include: an interposer interposed between the substrate and the first and second semiconductor chips, and including first through wiring lines that electrically connect the substrate with the first through electrodes of the first semiconductor chips and second through wiring lines that electrically connect the substrate with the second through electrodes of the second semiconductor chips.

The semiconductor package may further include: an interposer interposed between the substrate and the first and second semiconductor chips, and including first through wiring lines that electrically connect the substrate with the first semiconductor chip and second through wiring lines that electrically connect the substrate with the second through electrodes of the second semiconductor chips.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
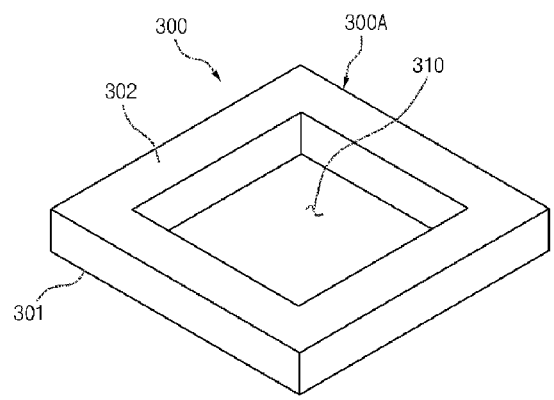
FIG. 1 is a perspective view illustrating a semiconductor chip in accordance with an exemplary embodiment of the present invention.

FIG. 1 is a perspective view illustrating a semiconductor chip in accordance with an exemplary embodiment of the present invention.

Referring to FIG. 1, a semiconductor chip 300 in accordance with an exemplary embodiment of the present invention includes a body part 300A and an opening 310.

The body part 300A has a first surface 301, a second surface 302, bonding pads (not shown), and a circuit unit (not shown).

The first surface 301 faces away from the second surface 302, and the circuit unit includes elements such as a transistor, a capacitor and a resistor to store and process data. The bonding pads are formed on the first surface 301 to serve as electrical contacts of the circuit unit for electrical connections with contacts external to the semiconductor chip 300.

The opening 310 passes through the first surface 301 and the second surface 302 of the body part 300A. When manufacturing a package by mounting the semiconductor chip 300 to a substrate, another semiconductor chip may be placed in the opening 310.

Figure 2:
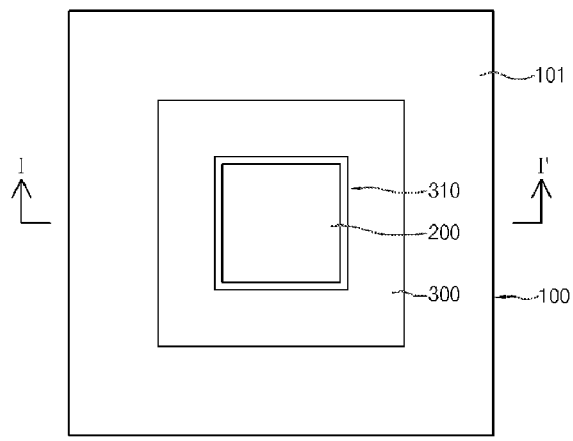
FIG. 2 is a plan view illustrating a semiconductor package in accordance with a first embodiment of the present invention.
Figure 3:
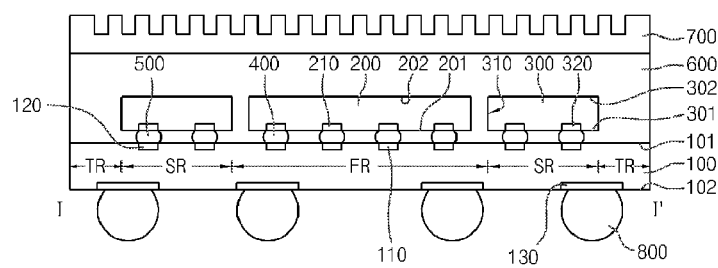
FIG. 3 is a cross-sectional view taken along the line I-I' of FIG. 2.

FIG. 2 is a plan view illustrating a semiconductor package in accordance with a first embodiment of the present invention, and FIG. 3 is a cross-sectional view taken along the line I-I' of FIG. 2.

Referring to FIGS. 2 and 3, the semiconductor package in accordance with the first embodiment of the present invention includes a substrate 100, a first semiconductor chip 200, and a second semiconductor chip 300. The semiconductor package further includes first and second connection members 400 and 500, a molded part 600, a heat sink 700, and external connection terminals 800.

The substrate 100 may be, for example, a printed circuit board (PCB). The substrate 100 is divided into a first region FR, a second region SR and a third region TR, and has an upper surface 101, a lower surface 102, first and second connection pads 110, and 120, and ball lands 130. The first region FR is defined at the center portion of the substrate 100, the third region TR is defined along the edges of the substrate 100, and the second region SR is defined between the first region FR and the third region TR. In the present embodiment, the first connection pads 110 are disposed in the first region FR on the upper surface 101 of the substrate 100, the second connection pads 120 are disposed in the second region SR on the upper surface 101 of the substrate 100, and the ball lands 130 are disposed on the lower surface 102 of the substrate 100 according to JEDEC regulations.

The first semiconductor chip 200 possesses, for example, a rectangular hexahedral shape, and has a first surface 201, a second surface 202 facing away from the first surface 201, and first bonding pads 210. The first bonding pads 210 are formed on the first surface 201 of the first semiconductor chip 200 and are electrically connected with the first connection pads 110 of the substrate 100. The first semiconductor chip 200 is placed in the first region FR on the upper surface 101 of the substrate 100. In the present embodiment, the first semiconductor chip 200 is placed in the first region FR on the upper surface 101 of the substrate 100 face-down such that the first surface 201 having the first bonding pads 210 faces the substrate 100.

The second semiconductor chip 300 possesses, for example, the shape of a hollow square frame, and has a first surface 301, a second surface 302 facing away from the first surface 301, an opening 310, and second bonding pads 320. The opening 310 passes through the first surface 301 and the second surface 302, and has a size and a sectional shape corresponding to those of the first semiconductor chip 200 such that the first semiconductor chip 200 can be exposed through the opening 310. In the present embodiment, the opening 310 has a size slightly greater than the first semiconductor chip 200 when viewed from the top. The second bonding pads 320 are disposed on the first surface 301 of the second semiconductor chip 300 and are electrically connected with the second connection pads 120 of the substrate 100.

The second semiconductor chip 300 is placed in the second region SR on the upper surface 101 of the substrate 100. In the present embodiment, the second semiconductor chip 300 may be placed in the second region SR on the upper surface 101 of the substrate 100 face-down such that the first surface 301 having the second bonding pads 320 faces the substrate 100. The second semiconductor chip 300 and the first semiconductor chip 200 may be different kinds of semiconductor chips. For example, the first semiconductor chip 200 may be a memory chip, and the second semiconductor chip 300 may be a system chip such as a CPU (central processing unit) and/or a GPU (graphic processing unit).

Figure 4:
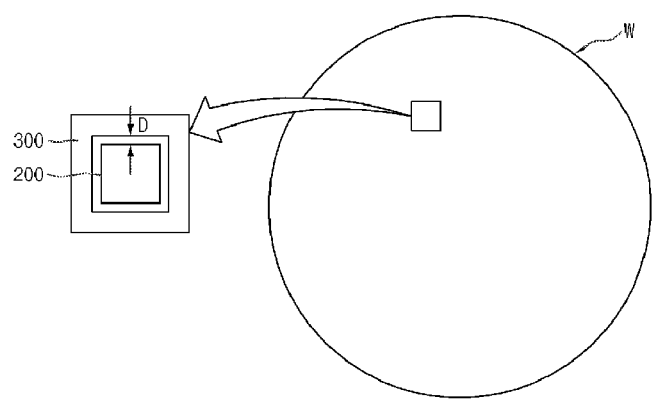
FIG. 4 is a plan view illustrating a wafer from which the first and second semiconductor chips shown in FIG. 2 are manufactured.

The first semiconductor chip 200 and the second semiconductor chip 300 may be individualized through a sawing process after they are manufactured on a wafer. For example, referring to FIG. 4, after the first semiconductor chip 200 and the second semiconductor chip 300 are manufactured on a wafer W through a semiconductor device manufacturing process, the wafer W may be cut to individualize the first and second semiconductor chips 200 and 300. A gap D between the first semiconductor chip 200 and the second semiconductor chip 300 may be controlled by changing a spot size of a laser beam which is used when cutting the wafer W. Although a single wafer was described as having both the first semiconductor chip 200 and the second semiconductor chip 300, the first semiconductor chip 200 may be from a first wafer and the second semiconductor chip 300 may be from a second wafer.

Referring again to FIGS. 2 and 3, the first connection members 400 may electrically connect the first bonding pads 210 of the first semiconductor chip 200 with the first connection pads 110 of the substrate 100, and the second connection members 500 may electrically connect the second bonding pads 320 of the second semiconductor chip 300 with the second connection pads 120 of the substrate 100. In the present embodiment, the first and second connection members 400 and 500 may include, for example, any ones of bumps and solder balls.

The molded part 600 seals the upper surface 101 of the substrate 100 including the first and second semiconductor chips 200 and 300. The molded part 600 may include, for example, an epoxy molding compound (EMC). The heat sink 700 is mounted onto the molded part 600, and the external connection terminals 800 are mounted to the ball lands 130 on the lower surface 102 of the substrate 100. The external connection terminals 800 may include, for example, solder balls.

Figure 5:
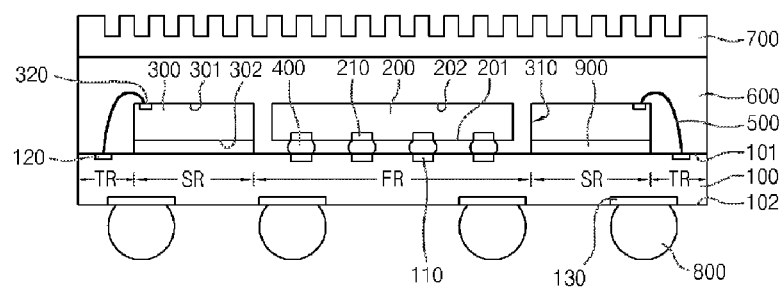
FIG. 5 is a cross-sectional view illustrating a semiconductor package in accordance with a second embodiment of the present invention.

FIG. 5 is a cross-sectional view illustrating a semiconductor package in accordance with a second embodiment of the present invention.

Unlike the first embodiment described above with reference to FIGS. 2 and 3, the semiconductor package in accordance with the second embodiment of the present invention has a construction in which a second semiconductor chip 300 is placed face-up and the second semiconductor chip 300 and a substrate 100 are connected by, for example, wire bonding. The first semiconductor chip 200 may still be face-down as shown in FIG. 3. The same terms and the same reference numerals will be used to refer to the same component parts in FIG. 5 as in FIGS. 2 and 3.

Referring to FIG. 5, the semiconductor package in accordance with the second embodiment of the present invention includes a substrate 100, a first semiconductor chip 200, and a second semiconductor chip 300. The semiconductor package further includes first and second connection members 400 and 500, a molded part 600, a heat sink 700, and external connection terminals 800.

The substrate 100 is divided into a first region FR, a second region SR and a third region TR, and has an upper surface 101, a lower surface 102, first and second connection pads 110 and 120, and ball lands 130. The first region FR is defined at the center portion of the substrate 100, the third region TR is defined along the edges of the substrate 100, and the second region SR is defined between the first region FR and the third region TR. In the present embodiment, the first connection pads 110 are disposed in the first region FR on the upper surface 101 of the substrate 100, the second connection pads 120 are disposed in the third region TR on the upper surface 101 of the substrate 100, and the ball lands 130 are disposed on the lower surface 102 of the substrate 100 according to JEDEC regulations.

The first semiconductor chip 200 possesses, for example, a rectangular hexahedral shape, and has a first surface 201, a second surface 202 facing away from the first surface 201, and first bonding pads 210. The first bonding pads 210 are formed on the first surface 201 of the first semiconductor chip 200 and are electrically connected with the first connection pads 110 of the substrate 100. The first semiconductor chip 200 is placed in the first region FR on the upper surface 101 of the substrate 100. In the present embodiment, the first semiconductor chip 200 is placed in the first region FR on the upper surface 101 of the substrate 100 face-down such that the first surface 201 having the first bonding pads 210 faces the substrate 100.

The second semiconductor chip 300 possesses, for example, the shape of a hollow square frame, and has a first surface 301, a second surface 302 facing away from the first surface 301, an opening 310 and second bonding pads 320. The opening 310 passes through the first surface 301 and the second surface 302, and has a size and a sectional shape corresponding to those of the first semiconductor chip 200 such that the first semiconductor chip 200 can be exposed through the opening 310. In the present embodiment, the opening 310 has a size slightly greater than the first semiconductor chip 200 when viewed from the top. The second bonding pads 320 are disposed on the first surface 301 of the second semiconductor chip 300 and are electrically connected with the second connection pads 120 of the substrate 100.

The second semiconductor chip 300 is placed in the second region SR on the upper surface 101 of the substrate 100. In the present embodiment, the second semiconductor chip 300 may be placed face-up in the second region SR on the upper surface 101 of the substrate 100. The second surface 302 of the second semiconductor chip 300 and the upper surface 101 of the substrate 100 are attached to each other by the medium of an adhesive member 900. The second semiconductor chip 300 and the first semiconductor chip 200 may be different kinds of semiconductor chips. For example, the first semiconductor chip 200 may be a memory chip, and the second semiconductor chip 300 may be a system chip such as a CPU and/or a GPU.

The first connection members 400 may electrically connect the first bonding pads 210 of the first semiconductor chip 200 with the first connection pads 110 of the substrate 100, and the second connection members 500 may electrically connect the second bonding pads 320 of the second semiconductor chip 300 with the second connection pads 120 of the substrate 100. In the present embodiment, the first connection members 400 may include, for example, any ones of bumps and solder balls, and the second connection members 500 may include, for example, wires.

The molded part 600 seals the upper surface 101 of the substrate 100 including the first and second semiconductor chips 200 and 300. The molded part 600 may include, for example, an epoxy molding compound (EMC). The heat sink 700 is mounted onto the molded part 600, and the external connection terminals 800 are mounted to the ball lands 130 on the lower surface 102 of the substrate 100. The external connection terminals 800 may include, for example, solder balls.

Figure 6:
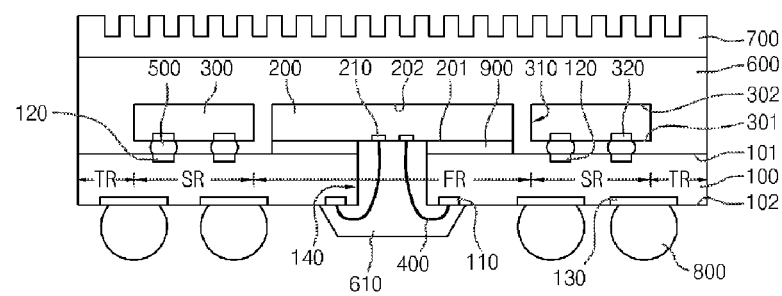
FIG. 6 is a cross-sectional view illustrating a semiconductor package in accordance with a third embodiment of the present invention.

FIG. 6 is a cross-sectional view illustrating a semiconductor package in accordance with a third embodiment of the present invention.

Unlike the first embodiment described above with reference to FIGS. 2 and 3, the semiconductor package in accordance with the third embodiment of the present invention has a construction in which the face-down first semiconductor chip 200 is connected to a substrate 100 by, for example, wire bonding. The second semiconductor chip 300 is as described in FIGS. 2 and 3. Therefore, the same terms and the same reference numerals will be used to refer to the same component parts in FIG. 6 as in FIGS. 2 and 3.

Referring to FIG. 6, the semiconductor package in accordance with the third embodiment of the present invention includes a substrate 100, a first semiconductor chip 200, and a second semiconductor chip 300. The semiconductor package further includes first and second connection members 400 and 500, a molded part 600, an additional molded part 610, a heat sink 700, and external connection terminals 800.

The substrate 100 is divided into a first region FR, a second region SR and a third region TR, and has an upper surface 101, a lower surface 102, first and second connection pads 110 and 120, ball lands 130, and a through hole 140. The first region FR is defined at the center portion of the substrate 100, the third region TR is defined along the edges of the substrate 100, and the second region SR is defined between the first region FR and the third region TR. The through hole 140 is defined through the center portion of the first region FR and passes through the upper surface 101 and the lower surface 102 of the substrate 100. In the present embodiment, the first connection pads 110 are disposed near the edges of the through hole 140 on the lower surface 102 of the substrate 100, and the second connection pads 120 are disposed in the second region SR on the upper surface 101 of the substrate 100. The ball lands 130 are disposed outside the first connection pads 110 on the lower surface 102 of the substrate 100 according to JEDEC regulations.

The first semiconductor chip 200 possesses, for example, a rectangular hexahedral shape, and has a first surface 201, a second surface 202 facing away from the first surface 201 and first bonding pads 210. The first bonding pads 210 are formed on the first surface 201 of the first semiconductor chip 200. The first semiconductor chip 200 is placed in the first region FR on the upper surface 101 of the substrate 100 face-down such that the first bonding pads 210 face the through hole 140 of the substrate 100. The first surface 201 of the first semiconductor chip 200 and the upper surface 101 of the substrate 100 are attached to each other by the medium of an adhesive member 900.

The second semiconductor chip 300 possesses, for example, the shape of a hollow square frame, and has a first surface 301, a second surface 302 facing away from the first surface 301, an opening 310 and second bonding pads 320. The opening 310 passes through the first surface 301 and the second surface 302, and has a size and a sectional shape corresponding to those of the first semiconductor chip 200 such that the first semiconductor chip 200 can be exposed through the opening 310. In the present embodiment, the opening 310 has a size slightly greater than the first semiconductor chip 200 when viewed from the top. The second bonding pads 320 are disposed on the first surface 301 of the second semiconductor chip 300 and are electrically connected with the second connection pads 120 of the substrate 100.

The second semiconductor chip 300 is placed in the second region SR on the upper surface 101 of the substrate 100 such that the first semiconductor chip 200 is exposed through the opening 310. In the present embodiment, the second semiconductor chip 300 may be placed in the second region SR on the upper surface 101 of the substrate 100 face-down such that the first surface 301 having the second bonding pads 320 faces the substrate 100.

The second semiconductor chip 300 and the first semiconductor chip 200 may be different kinds of semiconductor chips. For example, the first semiconductor chip 200 may be a memory chip, and the second semiconductor chip 300 may be a system chip such as a CPU and/or a GPU.

The first connection members 400 may electrically connect the first bonding pads 210 of the first semiconductor chip 200 with the first connection pads 110 of the substrate 100 through the through hole 140, and the second connection members 500 may electrically connect the second bonding pads 320 of the second semiconductor chip 300 with the second connection pads 120 of the substrate 100. In the present embodiment, the first connection members 400 may include, for example, wires, and the second connection members 500 may include, for example, any ones of bumps and solder balls.

The molded part 600 seals the upper surface 101 of the substrate 100 including the first and second semiconductor chips 200 and 300, and the additional molded part 610 seals the center portion of the lower surface 102 of the substrate 100 including the first connection members 400 and the through hole 140. Each of the molded part 600 and the additional molded part 610 may include, for example, an epoxy molding compound (EMC). The heat sink 700 is mounted onto the molded part 600, and the external connection terminals 800 are mounted to the ball lands 130 on the lower surface 102 of the substrate 100. The external connection terminals 800 may include solder balls.

Figure 7:
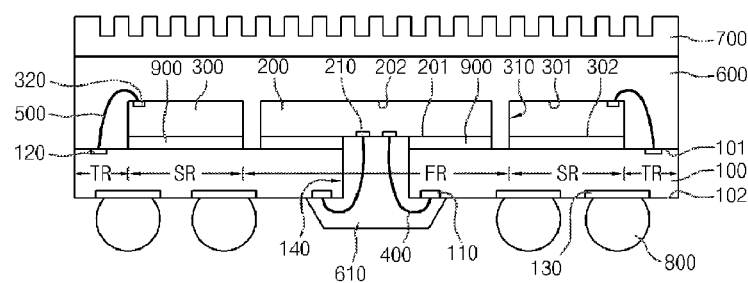
FIG. 7 is a cross-sectional view illustrating a semiconductor package in accordance with a fourth embodiment of the present invention.

FIG. 7 is a cross-sectional view illustrating a semiconductor package in accordance with a fourth embodiment of the present invention.

Unlike the first embodiment described above with reference to FIGS. 2 and 3, the semiconductor package in accordance with the fourth embodiment of the present invention has a construction in which a second semiconductor chip 300 is face-up and first and second semiconductor chips 200 and 300 are connected to a substrate 100 in a wire bonding type. The first semiconductor chip 200 is face-down. The same terms and the same reference numerals will be used to refer to the same component parts in FIG. 7 as in FIGS. 2 and 3.

Referring to FIG. 7, the semiconductor package in accordance with the fourth embodiment of the present invention includes a substrate 100, a first semiconductor chip 200, and a second semiconductor chip 300. The semiconductor package further includes first and second connection members 400 and 500, a molded part 600, an additional molded part 610, a heat sink 700, and external connection terminals 800.

The substrate 100 is divided into a first region FR, a second region SR and a third region TR, and has an upper surface 101, a lower surface 102, first and second connection pads 110 and 120, ball lands 130, and a through hole 140. The first region FR is defined at the center portion of the substrate 100, the third region TR is defined along the edges of the substrate 100, and the second region SR is defined between the first region FR and the third region TR. The through hole 140 is defined through the center portion of the first region FR and passes through the upper surface 101 and the lower surface 102 of the substrate 100. In the present embodiment, the first connection pads 110 are disposed near the edges of the through hole 140 on the lower surface 102 of the substrate 100, the second connection pads 120 are disposed in the third region TR on the upper surface 101 of the substrate 100, and the ball lands 130 are disposed outside the first connection pads 110 on the lower surface 102 of the substrate 100 according to JEDEC regulations.

The first semiconductor chip 200 possesses, for example, a rectangular hexahedral shape, and has a first surface 201, a second surface 202 facing away from the first surface 201 and first bonding pads 210. The first bonding pads 210 are formed on the center portion of the first surface 201 of the first semiconductor chip 200. The first semiconductor chip 200 is placed in the first region FR on the upper surface 101 of the substrate 100 face-down such that the first bonding pads 210 face the through hole 140 of the substrate 100. The first surface 201 of the first semiconductor chip 200 and the upper surface 101 of the substrate 100 are attached to each other by the medium of an adhesive member 900.

The second semiconductor chip 300 possesses, for example, the shape of a hollow square frame, and has a first surface 301, a second surface 302 facing away from the first surface 301, an opening 310 and second bonding pads 320. The opening 310 passes through the first surface 301 and the second surface 302, and has a size and a sectional shape corresponding to those of the first semiconductor chip 200 such that the first semiconductor chip 200 can be exposed through the opening 310. In the present embodiment, the opening 310 has a size slightly greater than the first semiconductor chip 200 when viewed from the top. The second bonding pads 320 are disposed on the first surface 301 of the second semiconductor chip 300 and are electrically connected with the second connection pads 120 of the substrate 100.

The second semiconductor chip 300 is placed in the second region SR on the upper surface 101 of the substrate 100 such that the first semiconductor chip 200 is exposed through the opening 310. In the present embodiment, the second semiconductor chip 300 may be placed in the second region SR on the upper surface 101 of the substrate 100 face-up with the second surface 302 facing the substrate 100. The second semiconductor chip 300 and the first semiconductor chip 200 may be different kinds of semiconductor chips. For example, the first semiconductor chip 200 may be a memory chip, and the second semiconductor chip 300 may be a system chip such as a CPU and/or a GPU.

The first connection members 400 may electrically connect the first bonding pads 210 of the first semiconductor chip 200 with the first connection pads 110 of the substrate 100 through the through hole 140, and the second connection members 500 may electrically connect the second bonding pads 320 of the second semiconductor chip 300 with the second connection pads 120 of the substrate 100. In the present embodiment, the first and second connection members 400 and 500 may include wires.

The molded part 600 seals the upper surface 101 of the substrate 100 including the first and second semiconductor chips 200 and 300, and the additional molded part 610 seals the center portion of the lower surface 102 of the substrate 100 including the first connection members 400 and the through hole 140. Each of the molded part 600 and the additional molded part 610 may include, for example, an epoxy molding compound (EMC). The heat sink 700 is mounted onto the molded part 600, and the external connection terminals 800 are mounted to the ball lands 130 on the lower surface 102 of the substrate 100. The external connection terminals 800 may include, for example, solder balls.

Figure 8:
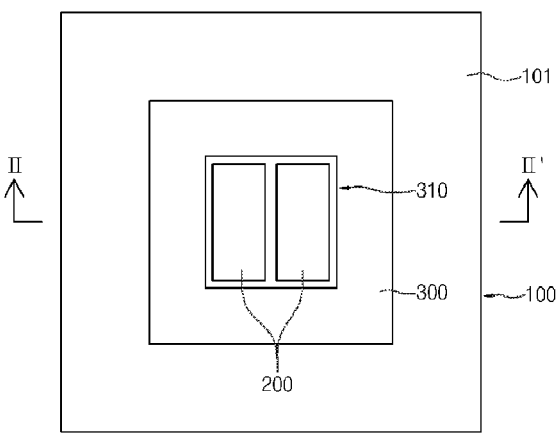
FIG. 8 is a plan view illustrating a semiconductor package in accordance with a fifth embodiment of the present invention.
Figure 9:
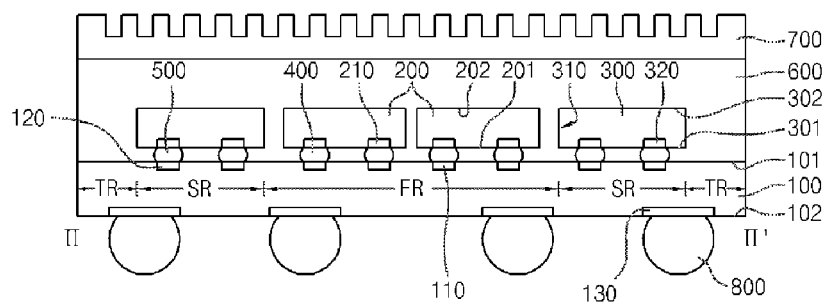
FIG. 9 is a cross-sectional view taken along the line II-II' of FIG. 8.

FIG. 8 is a plan view illustrating a semiconductor package in accordance with a fifth embodiment of the present invention, and FIG. 9 is a cross-sectional view taken along the line II-II' of FIG. 8.

Unlike the first embodiment described above with reference to FIGS. 2 and 3, the semiconductor package in accordance with the fifth embodiment of the present invention has a construction in which two first semiconductor chips 200 are provided. The semiconductor package in accordance with the fifth embodiment of the present invention still has substantially the same construction as the semiconductor package in accordance with the first embodiment except that there are two first semiconductor chips 200. Therefore, repeated descriptions for the same component elements will be omitted herein, and the same terms and the same reference numerals will be used to refer to the same component parts as shown in FIGS. 2 and 3.

Referring to FIGS. 8 and 9, in the present embodiment, two first semiconductor chips 200 are horizontally mounted on a substrate 100 exposed through an opening 310 of a second semiconductor chip 300.

All of the first semiconductor chips 200 may be, for example, the same kind of semiconductor chips. In the present embodiment, the first semiconductor chips 200 have the same size. However, the invention need not be so limited. Accordingly, the two first semiconductor chips 200 may be different from each other, and/or may have different sizes. While it is illustrated and explained in the present embodiment that the number of the first semiconductor chips 200 horizontally mounted on the substrate 100 exposed through the opening 310 of the second semiconductor chip 300 is two, the present invention is not limited to such. Accordingly, there may be one or more first semiconductor chips 200 horizontally mounted on the substrate 100 exposed through the opening 310 of the second semiconductor chip 300.

Figure 10:
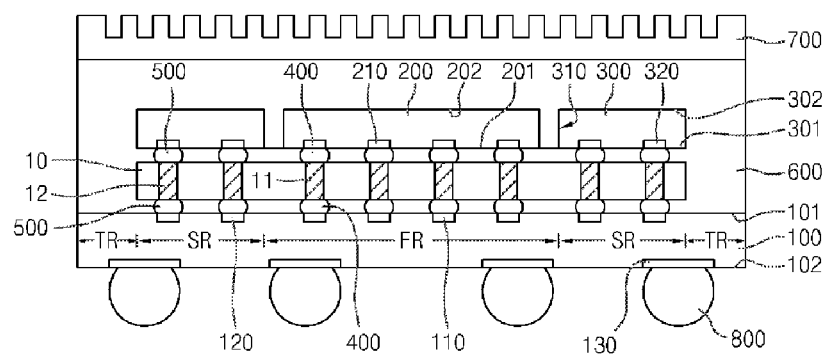
FIG. 10 is a cross-sectional view illustrating a semiconductor package in accordance with a sixth embodiment of the present invention.

FIG. 10 is a cross-sectional view illustrating a semiconductor package in accordance with a sixth embodiment of the present invention.

The semiconductor package in accordance with the sixth embodiment of the present invention has a construction in which an interposer 10 is added to the first embodiment described above with reference to FIGS. 2 and 3. Thus, the semiconductor package in accordance with the sixth embodiment of the present invention has substantially the same construction as the semiconductor package in accordance with the first embodiment except for the interposer 10. Therefore, repeated descriptions for the same component elements will be omitted herein, and the same terms and the same reference numerals will be used to refer to the same component parts as shown in FIGS. 2 and 3.

Referring to FIG. 10, the semiconductor package in accordance with the sixth embodiment of the present invention includes a substrate 100, and first and second semiconductor chips 200 and 300. The semiconductor package further includes an interposer 10, first and second connection members 400 and 500, a molded part 600, a heat sink 700, and external connection terminals 800.

In the present embodiment, the interposer 10 is disposed between the substrate 100 and the first and second semiconductor chips 200 and 300, and includes first through wiring lines 11 and second through wiring lines 12.

The first through wiring lines 11 may electrically connect first connection pads 110 of the substrate 100 with first bonding pads 210 of the first semiconductor chip 200, and the second through wiring lines 12 electrically connect second connection pads 120 of the substrate 100 with second bonding pads 320 of the second semiconductor chip 300. The first connection members 400 are formed between the first bonding pads 210 of the first semiconductor chip 200 and the first through wiring lines 11 of the interposer 10 and between the first through wiring lines 11 of the interposer 10 and the first connection pads 110 of the substrate 100, and may electrically connect them with each other. The second connection members 500 are formed between the second bonding pads 320 of the second semiconductor chip 300 and the second through wiring lines 12 of the interposer 10 and between the second through wiring lines 12 of the interposer 10 and the second connection pads 120 of the substrate 100, and may electrically connect them with each other. The first and second connection members 400 and 500 may include, for example, bumps or solder balls.

Figure 11:
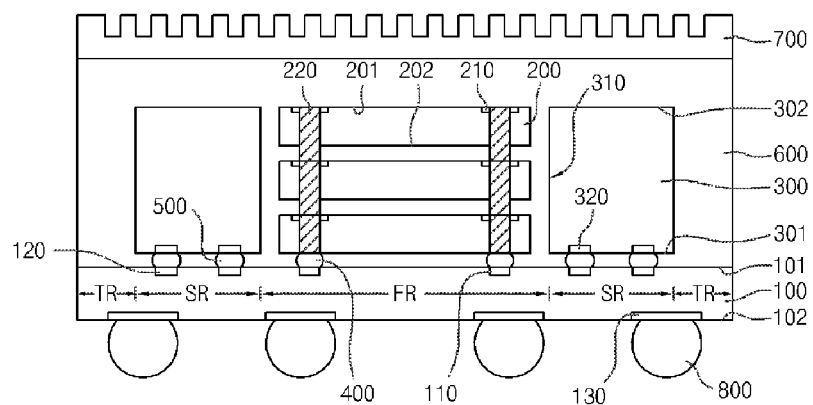
FIG. 11 is a cross-sectional view illustrating a semiconductor package in accordance with a seventh embodiment of the present invention.

FIG. 11 is a cross-sectional view illustrating a semiconductor package in accordance with a seventh embodiment of the present invention.

Unlike the first embodiment described above with reference to FIGS. 2 and 3, the semiconductor package in accordance with the seventh embodiment of the present invention has a construction in which each of multiple first semiconductor chips 200 has first through electrodes 220, and at least two first semiconductor chips 200 are stacked to be connected with one another through first through electrodes 220. Repeated descriptions for the same component elements will be omitted herein, and the same terms and the same reference numerals will be used to refer to the same component parts as in FIGS. 2 and 3.

Referring to FIG. 11, the semiconductor package in accordance with the seventh embodiment of the present invention includes a substrate 100, a plurality of first semiconductor chips 200, and a second semiconductor chip 300. The semiconductor package further includes first and second connection members 400 and 500, a molded part 600, a heat sink 700, and external connection terminals 800.

In the present embodiment, each first semiconductor chip 200 has a first surface 201, a second surface 202 facing away from the first surface 201, first bonding pads 210, and first through electrodes 220.

The bonding pads 210 are formed on the first surface 201 of the first semiconductor chip 200, and the first through electrodes 220 pass through the first surface 201 and the second surface 202 of the first semiconductor chip 200 and are electrically connected with the first bonding pads 210. In the present embodiment, the first through electrodes 220 are formed to pass through the first bonding pads 210. The first through electrodes 220 may pass through parts that are electrically connected with the first bonding pads 210.

The plurality of first semiconductor chips 200 are stacked in a first region FR of the substrate 100 such that the first through electrodes 220 of the plurality of first semiconductor chips 200 are vertically connected with one another. While not shown, connection members may be interposed, as required, between the first through electrodes 220 of the stacked first semiconductor chips 200 and electrically connect the first through electrodes 220 with one another. The first through electrodes 220 of the first semiconductor chip 200 positioned lowermost among the plurality of first semiconductor chips 200 are electrically connected with first connection pads 110 the substrate 100.

While it was described in the present embodiment that the plurality of first semiconductor chips 200 are stacked by the medium of through electrodes and the second semiconductor chip 300 constitutes a single layer, it is conceivable that the first semiconductor chip 200 may constitute a single layer and a plurality of second semiconductor chips 300 may be stacked by the medium of through electrodes. Or that the first semiconductor chips 200 may be layered and the second semiconductor chips 300 may also be layered.

Figure 12:
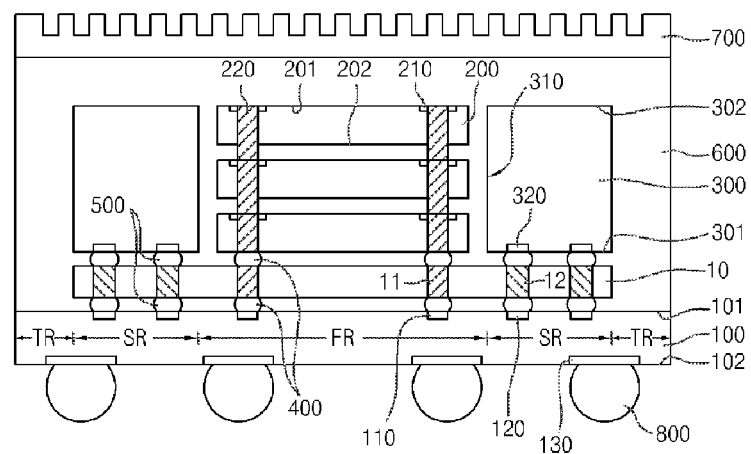
FIG. 12 is a cross-sectional view illustrating a semiconductor package in accordance with an eighth embodiment of the present invention.

FIG. 12 is a cross-sectional view illustrating a semiconductor package in accordance with an eighth embodiment of the present invention.

The semiconductor package in accordance with the eighth embodiment of the present invention has a construction in which an interposer 10 is added to the seventh embodiment described above with reference to FIG. 11. Therefore, the same terms and the same reference numerals will be used to refer to the same component parts as in FIG. 11.

Referring to FIG. 12, the semiconductor package in accordance with the eighth embodiment of the present invention includes a substrate 100, a plurality of first semiconductor chips 200, and a second semiconductor chip 300. The semiconductor package further includes an interposer 10, first and second connection members 400 and 500, a molded part 600, a heat sink 700, and external connection terminals 800.

In the present embodiment, the interposer 10 is disposed between the substrate 100 and the first and second semiconductor chips 200 and 300, and includes first through wiring lines 11 and second through wiring lines 12.

The first through wiring lines 11 may electrically connect first connection pads 110 of the substrate 100 with first through electrodes 220 of the first semiconductor chip 200 positioned lowermost among the plurality of first semiconductor chips 200 stacked upon one another, and the second through wiring lines 12 electrically connect second connection pads 120 of the substrate 100 with second bonding pads 320 of the second semiconductor chip 300.

The first connection members 400 are formed between the first through electrodes 220 of the lowermost first semiconductor chip 200 and the first through wiring lines 11 of the interposer 10 and between the first through wiring lines 11 of the interposer 10 and the first connection pads 110 of the substrate 100, and may electrically connect them with each other. The second connection members 500 are formed between the second bonding pads 320 of the second semiconductor chip 300 and the second through wiring lines 12 of the interposer 10 and between the second through wiring lines 12 of the interposer 10 and the second connection pads 120 of the substrate 100, and may electrically connect them with each other. The first and second connection members 400 and 500 may include bumps or solder balls.

Figure 13:
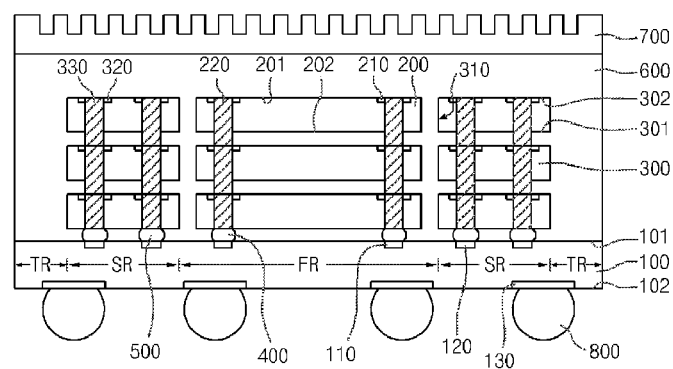
FIG. 13 is a cross-sectional view illustrating a semiconductor package in accordance with a ninth embodiment of the present invention.

FIG. 13 is a cross-sectional view illustrating a semiconductor package in accordance with a ninth embodiment of the present invention.

Unlike the seventh embodiment described above with reference to FIG. 11, the semiconductor package in accordance with the ninth embodiment of the present invention has a construction in which each second semiconductor chip 300 has second through electrodes 330 and at least two second semiconductor chips 300 are stacked in such a way as to be connected with one another through second through electrodes 330. Therefore, the same terms and the same reference numerals will be used to refer to the same component parts as in FIG. 11.

Referring to FIG. 13, the semiconductor package in accordance with the ninth embodiment of the present invention includes a substrate 100, a plurality of first semiconductor chips 200, and a plurality of second semiconductor chips 300. The semiconductor package further includes first and second connection members 400 and 500, a molded part 600, a heat sink 700, and external connection terminals 800.

Each second semiconductor chip 300 possesses the shape of a hollow square frame, and has a first surface 301, a second surface 302 facing away from the first surface 301, an opening 310, second bonding pads 320, and second through electrodes 330. In the present embodiment, the second through electrodes 330 are formed to pass through the second bonding pads 320. The second through electrodes 330 may pass through parts electrically connected with the second bonding pads 320.

The plurality of second semiconductor chips 300 are stacked in a second region SR of the substrate 100 such that the second through electrodes 330 of the plurality of second semiconductor chips 300 are vertically connected with one another. While not shown, connection members are interposed between the second through electrodes 330 of the stacked second semiconductor chips 300 and electrically connect the second through electrodes 330 with one another. The second through electrodes 330 of the second semiconductor chip 300 positioned lowermost among the plurality of second semiconductor chips 300 are electrically connected with second connection pads 120 the substrate 100.

Figure 14:
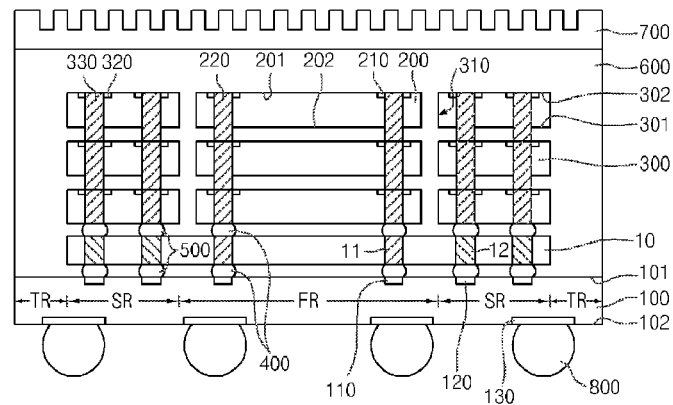
FIG. 14 is a cross-sectional view illustrating a semiconductor package in accordance with a tenth embodiment of the present invention.

FIG. 14 is a cross-sectional view illustrating a semiconductor package in accordance with a tenth embodiment of the present invention.

The semiconductor package in accordance with the tenth embodiment of the present invention has a construction in which an interposer 10 is added to the ninth embodiment described above with reference to FIG. 13. Therefore, the same terms and the same reference numerals will be used to refer to the same component parts as in FIG. 13.

Referring to FIG. 14, the semiconductor package in accordance with the tenth embodiment of the present invention includes a substrate 100, a plurality of first semiconductor chips 200, and a plurality of second semiconductor chips 300. Besides, the semiconductor package further includes an interposer 10, first and second connection members 400 and 500, a molded part 600, a heat sink 700, and external connection terminals 800.

In the present embodiment, the interposer 10 is disposed between the substrate 100 and the first and second semiconductor chips 200 and 300, and includes first through wiring lines 11 and second through wiring lines 12.

The first through wiring lines 11 may electrically connect first connection pads 110 of the substrate 100 with first through electrodes 220 of the first semiconductor chip 200 positioned lowermost among the plurality of first semiconductor chips 200 stacked upon one another, and the second through wiring lines 12 electrically connect second connection pads 120 of the substrate 100 with second through electrodes 330 of the second semiconductor chip 300 positioned lowermost among the plurality of second semiconductor chips 300 stacked upon one another.

The first connection members 400 are formed between the first through electrodes 220 of the lowermost first semiconductor chip 200 and the first through wiring lines 11 of the interposer 10 and between the first through wiring lines 11 of the interposer 10 and the first connection pads 110 of the substrate 100, and may electrically connect them with each other. The second connection members 500 are formed between the second through electrodes 330 of the lowermost second semiconductor chip 300 and the second through wiring lines 12 of the interposer 10 and between the second through wiring lines 12 of the interposer 10 and the second connection pads 120 of the substrate 100, and may electrically connect them with each other. The first and second connection members 400 and 500 may include bumps or solder balls.

According to various embodiments of the present invention, since a second semiconductor chip is formed to have a structure surrounding the periphery of a first semiconductor chip, the heat generated in the second semiconductor chip can uniformly influence the first semiconductor chip, and local thermal damage may be reduced. Also, since an overlap area between the second semiconductor chip and a heat sink increases, the heat generated in the second semiconductor chip can be reliably dissipated, thereby reducing thermal damage. In addition, because the second semiconductor chip is placed in a marginal space around the first semiconductor chip, the degree of integration may be improved.

The semiconductor packages described above may be applied to various package modules.

Figure 15:
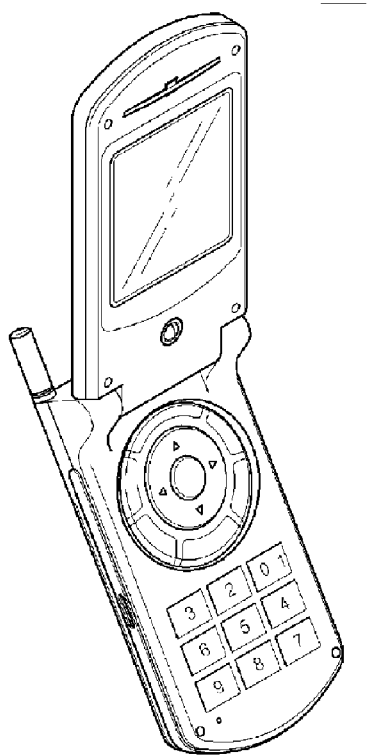
FIG. 15 is a perspective view illustrating an electronic apparatus having the semiconductor package according to an embodiment of the present invention.

FIG. 15 is a perspective view illustrating an electronic apparatus having the semiconductor package according to an embodiment of the present invention.

Referring to FIG. 15, the semiconductor packages according to the embodiments of the present invention may be applied to an electronic apparatus 1000 such as a portable phone. Since the semiconductor packages according to various embodiments of the present invention are excellent in view of size reduction and electrical characteristics, they are advantageous in terms of light weight, thinness, compactness, and miniaturization of the electronic apparatus 1000. The electronic apparatus 1000 is not limited to the portable phone as shown in FIG. 15, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 16:
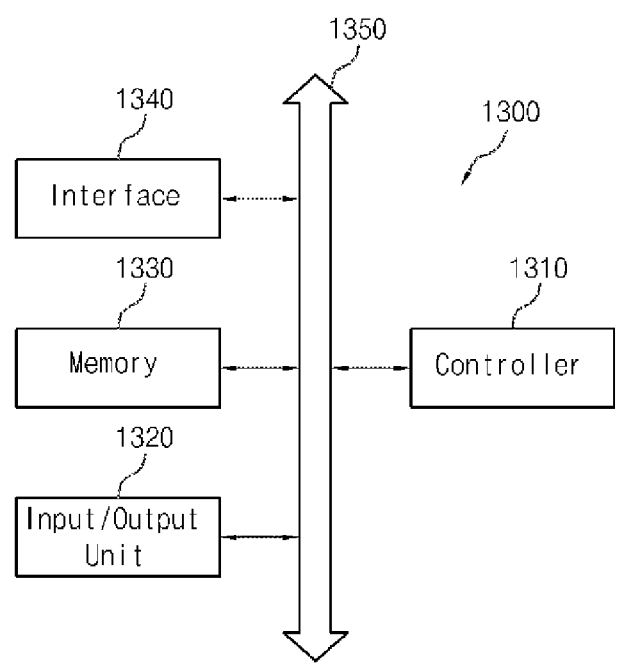
FIG. 16 is a system block diagram of the electronic apparatus to which the semiconductor package according to an embodiment of the present invention is applied.

FIG. 16 is a system block diagram of the electronic apparatus using a semiconductor package according to an embodiment of the present invention.

Referring to FIG. 16, an electronic system 1300 may include a controller 1310, an input/output unit 1320, and a memory 1330. The controller 1310, the input/output unit 1320, and the memory 1330 may be coupled with one another through a bus 1350. The bus 1350 serves as a path through which data may be transmitted. For example, the controller 1310 may include one or more of a microprocessor, a digital signal processor, a microcontroller, and logic devices capable of performing the same functions as these components. The controller 1310 and the memory 1330 may include a semiconductor package according to an embodiment of to the present invention. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. The memory 1330 may comprise, for example, flash memory. For example, a flash memory to which an embodiment of the present invention is applied may be mounted to an information processing system such as a mobile terminal or a desk top computer. The flash memory may be constituted by a semiconductor disc device (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a substrate;
   a first semiconductor chip placed on an upper surface of the substrate; and
   a second semiconductor chip having an opening which corresponds to the first semiconductor chip, and placed on the upper surface of the substrate such that the first semiconductor chip is exposed through the opening.

2. The semiconductor package according to claim 1, wherein the first semiconductor chip and the second semiconductor chip are different kinds of chips.

3. The semiconductor package according to claim 2, wherein the first semiconductor chip is a memory chip, and the second semiconductor chip is a system chip.

4. The semiconductor package according to claim 1, wherein the first semiconductor chip has a rectangular hexahedral shape, and the second semiconductor chip has the shape of a hollow rectangular frame.

5. The semiconductor package according to claim 1, further comprising:
   a molded part sealing the upper surface of the substrate including the first and second semiconductor chips; and
   external connection terminals mounted to a lower surface of the substrate.

6. The semiconductor package according to claim 5, further comprising:
   a heat sink mounted onto the molded part.

7. The semiconductor package according to claim 1, wherein the substrate includes on the upper surface thereof first connection pads electrically connected with the first semiconductor chip and second connection pads electrically connected with the second semiconductor chip.

8. The semiconductor package according to claim 7, wherein the first semiconductor chip includes, on a first surface thereof facing the substrate, bonding pads electrically connected with the first connection pads of the substrate.

9. The semiconductor package according to claim 8, further comprising:
   connection members electrically connecting the bonding pads of the first semiconductor chip with the first connection pads of the substrate.

10. The semiconductor package according to claim 9, wherein the connection members comprise at least one of bumps and solder balls.

11. The semiconductor package according to claim 7, wherein the second semiconductor chip includes, on one surface thereof facing the substrate, bonding pads electrically connected with the second connection pads of the substrate.

12. The semiconductor package according to claim 11, further comprising:
   connection members electrically connecting the bonding pads of the second semiconductor chip with the second connection pads of the substrate.

13. The semiconductor package according to claim 12, wherein the connection members comprise at least one of bumps and solder balls.

14. The semiconductor package according to claim 7, wherein the second semiconductor chip includes, on the surface facing away from the substrate, bonding pads electrically connected with the second connection pads of the substrate.

15. The semiconductor package according to claim 14, further comprising:
   connection members electrically connecting the bonding pads of the second semiconductor chip with the second connection pads of the substrate.

16. The semiconductor package according to claim 15, wherein the connection members comprise wires.

17. The semiconductor package according to claim 1, wherein the substrate includes:
   a through hole passing through the upper surface and the lower surface;
   first connection pads formed on the lower surface and electrically connected with the first semiconductor chip; and
   second connection pads formed on the upper surface and electrically connected with the second semiconductor chip.

18. The semiconductor package according to claim 17, wherein the first semiconductor chip includes, on a first surface thereof facing the substrate, bonding pads electrically connected with the first connection pads of the substrate.

19. The semiconductor package according to claim 18, further comprising:
   connection members electrically connecting the bonding pads of the first semiconductor chip with the first connection pads of the substrate through the through hole.

20. The semiconductor package according to claim 19, wherein the connection members comprise wires.

21. The semiconductor package according to claim 19, further comprising:
an additional molded part sealing a center portion of the lower surface of the substrate including the through hole and the connection members.

22. The semiconductor package according to claim 1, wherein at least two first semiconductor chips are horizontally mounted on the upper surface of the substrate in the opening.

23. The semiconductor package according to claim 22, wherein the first semiconductor chips are the same kind of chips.

24. The semiconductor package according to claim 22, wherein at least one of the first semiconductor chips is a different kind of chip from the other first semiconductor chips.

25. The semiconductor package according to claim 22, wherein the first semiconductor chips have the same size.

26. The semiconductor package according to claim 22, wherein at least one of the first semiconductor chips has a different size from another of the first semiconductor chips.

27. The semiconductor package according to claim 1, further comprising:
an interposer interposed between the substrate and the first and second semiconductor chips, and including first through wiring lines that electrically connect the substrate with the first semiconductor chip and second through wiring lines that electrically connect the substrate with the second semiconductor chip.

28. The semiconductor package according to claim 1, wherein the first semiconductor chip further includes first through electrodes that pass through the first surface facing the substrate and a second surface facing away from the first surface.

29. The semiconductor package according to claim 28, wherein at least two first semiconductor chips are stacked such that first through electrodes of the respective first semiconductor chips are vertically connected with each other.

30. The semiconductor package according to claim 29, further comprising:
an interposer interposed between the substrate and the first and second semiconductor chips, and including first through wiring lines that electrically connect the substrate with the first through electrodes of the first semiconductor chips and second through wiring lines that electrically connect the substrate with the second semiconductor chip.

31. The semiconductor package according to claim 29, wherein the second semiconductor chip further includes second through electrodes that pass through the first surface facing the substrate and the second surface facing away from the first surface.

32. The semiconductor package according to claim 31, wherein at least two second semiconductor chips are stacked such that second through electrodes of the respective second semiconductor chips are vertically connected with each other.

33. The semiconductor package according to claim 32, further comprising:
an interposer interposed between the substrate and the first and second semiconductor chips, and including first through wiring lines that electrically connect the substrate with the first through electrodes of the first semiconductor chips and second through wiring lines that electrically connect the substrate with the second through electrodes of the second semiconductor chips.

34. The semiconductor package according to claim 1, wherein the second semiconductor chip includes second through electrodes that pass through a first surface facing the substrate and a second surface facing away from the first surface.

35. The semiconductor package according to claim 34, wherein at least two second semiconductor chips are stacked such that second through electrodes of the respective second semiconductor chips are vertically connected with each other.

36. The semiconductor package according to claim 35, further comprising:
an interposer interposed between the substrate and the first and second semiconductor chips, and including first through wiring lines that electrically connect the substrate with the first semiconductor chip and second through wiring lines that electrically connect the substrate with the second through electrodes of the second semiconductor chips.

* * * * *